United States Patent
Shinchi

[11] Patent Number: 5,967,829
[45] Date of Patent: Oct. 19, 1999

[54] WATERPROOF CONNECTOR

[75] Inventor: Akira Shinchi, Shizuoka-ken, Japan

[73] Assignee: Yazaki Corporation, Tokyo, Japan

[21] Appl. No.: 09/003,706

[22] Filed: Jan. 7, 1998

[30] Foreign Application Priority Data

Jan. 8, 1997 [JP] Japan ................................. 9-001636

[51] Int. Cl.⁶ ................................................. H01R 13/58
[52] U.S. Cl. ............................................ 439/467; 29/871
[58] Field of Search ................................ 439/587, 467, 439/465; 29/868, 869, 871

[56] References Cited

FOREIGN PATENT DOCUMENTS

| | | |
|---|---|---|
| 0048930 A1 | 9/1981 | European Pat. Off. . |
| 50-54591 | 5/1975 | Japan . |
| 9800192 | 5/1998 | United Kingdom . |

Primary Examiner—Steven L. Stephan
Assistant Examiner—Javaid Nasri
Attorney, Agent, or Firm—Finnegan, Henderson, Farabow, Garrett & Dunner, L.L.P.

[57] ABSTRACT

A waterproof connector is low in manufacturing cost and has an enhanced waterproofness by complete prevention of the entry of water from a core wire being enabled. A cover portion is formed on an end portion of a housing and on the cover portion there is mounted a rubber-like elastic member having a semi-circular accommodation groove permitting a covered electric wire to pass therethrough. An upper cover portion is welded to the cover portion by ultrasonic oscillation. On the upper cover portion there is mounted a rubber-like elastic member brought into pressure contact with the covered electric wire together with the rubber-like elastic member as well as a core wire waterproofing member. When the ultrasonic oscillation is made, the core wire waterproofing member and a bottom surface portion of the cover portion are welded to each other. In this welded portion, a core wire of the covered electric wire whose covering portion has been removed when the ultrasonic oscillation is made is fixed in a state of its being embedded therein.

8 Claims, 4 Drawing Sheets

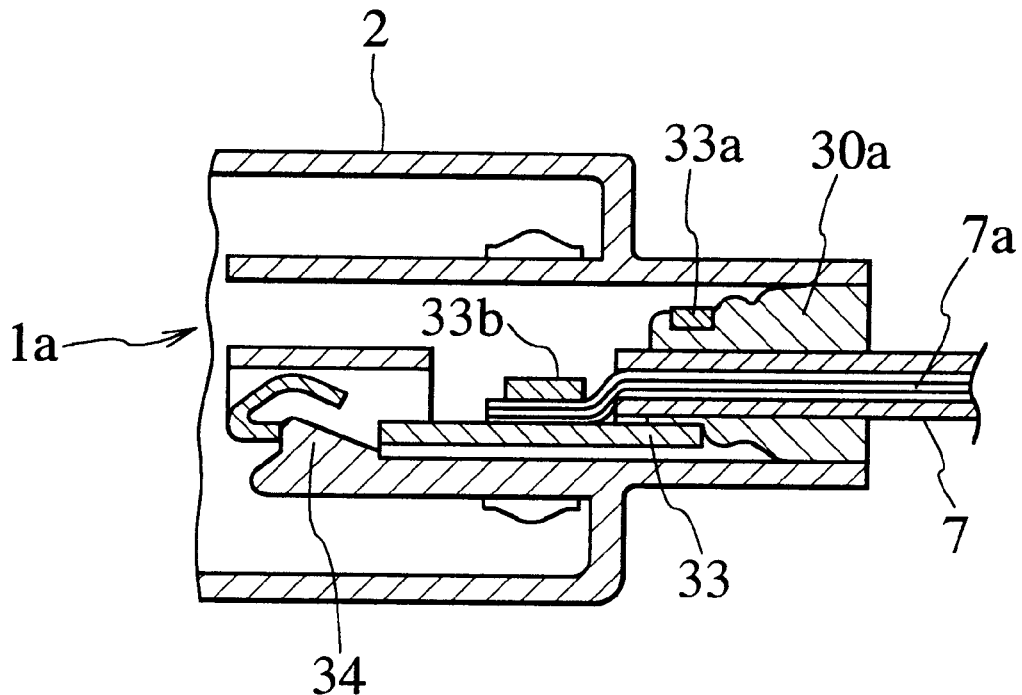
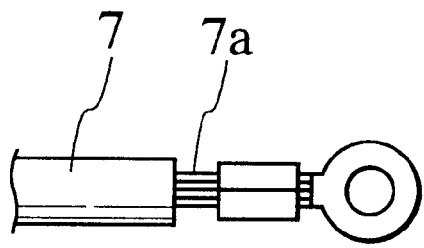
FIG. 3A
PRIOR ART
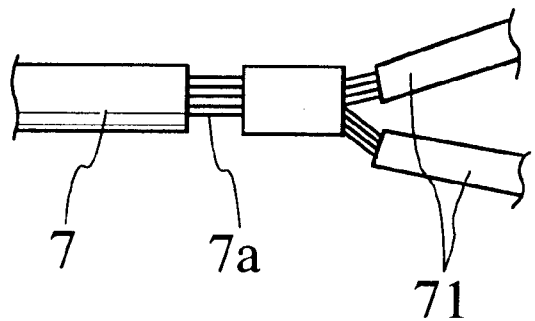
FIG. 3B
PRIOR ART

WATERPROOF CONNECTOR

BACKGROUND OF THE INVENTION

1. Field of the Invention

The present invention relates to a waterproof connector and a method of manufacturing the same and, more particularly, to a waterproof connector adapted to interrupt entry of water into a covered electric wire so as to prevent water from entering into the connector by way of a core wire thereof and a method of manufacturing the same.

2. Description of Relevant Art

In FIGS. 1A and 1B and FIG. 2, there is shown a conventional example of a waterproof structure for an electric wire drawout portion of a waterproof connector (see Japanese Utility Model Application Laid-Open Publication No. 50-54591).

The waterproof connector shown in FIGS. 1A and 1B is of a structure wherein a covered electric wire 7 is clamped by two split upper and lower rubber plugs 30 (see FIG. 1A) and the rubber plugs 30 are forcedly inserted into a concavity portion 32 of a connector housing 2 as in FIG. 1B in a state where the covered electric wire 7 has been fitted into grooves 31 of the rubber plugs 30.

Also, a waterproof connector 1a shown in FIG. 2 is of a structure wherein each covered electric wire 7 is covered by corresponding individual rubber plugs 30a and respective end portions of these rubber plugs 30a are caulked (33a) to a terminal 33 and, in this state, are forcedly inserted into a connector housing 2.

In any one of these waterproof connectors 1 and 1a, as shown in FIG. 2, within the interior of the connector housing 2, a core wire 7a of the covered electric wire 7 is caulked (33b) to the terminal 33 and this terminal 33 is retained by a retaining portion 34.

Each of the waterproof connectors having the above-described structures involves therein the problem that although an outer periphery of the covered electric wire 7 is sealed by the rubber plugs 30 (or 30a), water cannot be prevented from advancing along the core wire 7a and entering into the interior of the connector housing 2.

Generally, in the case of a covered electric wire, ordinarily, it does not happen that water enters into the interior of a core wire thereof. However, for example, in a case where the covered electric wire 7 connected to the waterproof connector 1 or 1a is earthed as shown in FIG. 3A, or where separate covered electric wires 71 are joined together as shown in FIG. 3B, it sometimes happens that the core wire 7a of the covered electric wire 7 has its covering portion removed to expose the core wire 7a. In such a case, when this exposed core wire 7a is caught by water and as a result the ambient temperature upon the waterproof connector 1 decreases, the pressure in the connector housing 2 also decreases with the result that the connector housing 2 absorbs water. The water which has entered into the interior of the waterproof connector 1 in this way causes a contact to be shortcircuited or corroded.

Further, there are also other problems that the operation of fitting the rubber plugs 30, 30a into the connector housing 2 is troublesome and that, in addition, in the case of the rubber plug 30 in particular, it is necessary to mold the rubber plug 30 by replacing a relevant mold in correspondence with the size of the electric wire and the number of the poles, with the result that the manufacturing cost increases.

SUMMARY OF THE INVENTION

The present invention has been achieved with such points in view.

It therefore is an object of the present invention to provide a waterproof connector which is low in manufacturing cost and has an enhanced waterproofness by complete prevention of the entry of water from the core wire being enabled and a method of manufacturing the same.

To achieve the object, a first aspect of the invention provides a waterproof connector adapted to cover a covered electric wire drawn out from a connector housing by rubber-like elastic members to thereby waterproof the covered electric wire, in which on an end portion of the connector housing there is formed a cover portion having the covered electric wire drawn out thereonto; an upper cover portion is welded to the cover portion by ultrasonic oscillation in such a way as to cover an upper open portion of the cover portion; the upper cover portion has a core wire waterproofing member formed thereon; and the core wire waterproofing member and a bottom surface portion of the cover portion are welded to each other between core wires when ultrasonic oscillation is made and, in this welded portion, a core wire of the covered electric wire whose covering portion has been removed when the ultrasonic oscillation is made is fixed in a state of its being embedded between the core wire waterproofing member and the bottom surface portion.

According to the first aspect, as the core wire is brought to a state of its being embedded in between the core wire waterproofing member and the bottom surface portion, the water which extends to the core wire is stopped there and is thereby prevented from entering into the interior of the connector housing.

Accordingly, shortcircuiting or corrosion of an electric contact does not occur, with the result that a highly reliable waterproof connector is obtained.

A second aspect of the invention provides a waterproof connector wherein on the cover portion and the upper cover portion there are mounted rubber-like elastic members for sealing the covered electric wire by pressurizing the covered electric wire and clamping this covered electric wire therebetween in such a way as to be situated in front of the core wire waterproofing member.

According to the second aspect, the covered electric wire is sealed in a state of its being compressed by the upper and the lower rubber-like elastic member and is brought to a state where a pressure has been applied onto the electric wire from an entire circumference thereof. Therefore, no gap is produced around the electric wire, so that complete waterproofness is obtained also at the covering portion of the covered electric wire.

A third aspect of the invention provides a waterproof connector wherein on the bottom surface portion of the cover portion there are formed partitioning plates situated on both side surfaces of the core wire waterproofing member.

According to the third aspect, the core wire waterproofing member is fitted between the partitioning plates and therefore positioning for mounting the upper cover portion can be performed in a simple way. This provides an advantage in a case where the upper cover portion and the cover portion are constructed separately from each other.

Accordingly, the mounting operation becomes easy to perform.

A fourth aspect of the invention provides a method of manufacturing a waterproof connector covering a covered electric wire drawn out from a connector housing by rubber-like elastic members to thereby waterproof the covered electric wire, which comprises the steps of causing the covered electric wire to be drawn out from the connector housing and thereafter setting the covered electric wire on the rubber-like elastic member provided on a cover portion in front of the connector housing, setting an upper cover portion on the cover portion and thereby setting the rubber-like elastic member provided on the upper cover portion on the rubber-like elastic member of the cover portion and simultaneously clamping the covered electric wire between a core wire waterproofing member formed on the upper cover portion and a bottom surface portion of the cover portion, and setting an ultrasonic horn onto the upper cover portion and applying a load onto the upper cover portion while oscillating the ultrasonic horn to thereby weld the cover portion and the upper cover portion to each other and, simultaneously, pressurizing the covered electric wire and clamping the same between the core wire waterproofing member and the bottom portion of the cover portion to thereby weld and fix the core wire waterproofing member and the bottom surface portion to each other while removing a covering portion of the covered electric wire by the ultrasonic oscillation.

According to the fourth aspect, ultrasonic waves are oscillated in a state where the covered electric wire is pressurized and clamped between the core wire waterproofing member and the bottom surface portion, whereby the covering portion is removed and simultaneously there is formed a state where the core wire is embedded in between the core wire waterproofing member and the bottom surface portion, by mutual welding between the core wire waterproofing member and the bottom surface portion. Also, the covered electric wire is sealed in a state of its being compressed between the upper and the lower rubber-like elastic member and there occurs a state where a pressure has been applied to the covered electric wire from an entire circumference thereof, with the result that there is formed a seal for the covering portion of the covered electric wire, wherein no gap is produced around the covered electric wire.

Accordingly, the covering portion is removed by the ultrasonic oscillation and simultaneously the cover portion and the upper cover portion are welded to each other and further there is formed by welding of the core wire waterproofing member and the bottom surface portion a seal portion that exhibits a state where the core wire of the covered electric wire is embedded in therebetween. The manufacturing process is thus simplified and in consequence the manufacturing cost is reduced. Further, there is formed a seal portion for the covering portion wherein no gap is produced around the covered electric wire, with the result that it is possible to provide a waterproof connector having an enhanced waterproofness in cooperation with the seal portion for the core wire.

BRIEF DESCRIPTION OF THE ACCOMPANYING DRAWINGS

The above and further objects and novel features of the present invention will more fully appear from the following detailed description when the same is read in conjunction with the accompanying drawings, in which:

FIG. 2 is a longitudinal sectional side view of another conventional waterproof connector;

FIGS. 3A and 3B show two examples of a wired state of a covered electric wire;

DETAILED DESCRIPTION OF THE PREFERRED EMBODIMENTS

Figure 1A:
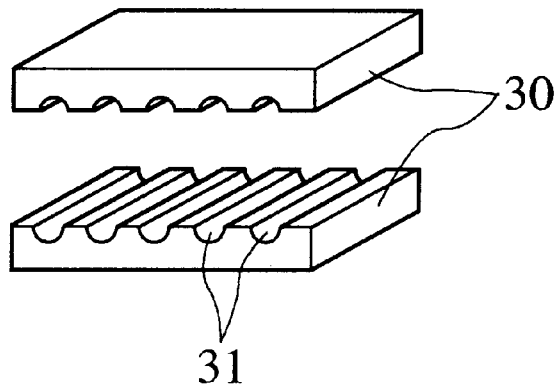
FIGS. 1A and 1B are perspective views showing a conventional waterproof connector, FIG. 1A showing a manufacturing step thereof, and FIG. 1B showing the waterproof connector after manufactured.
Figure 1B:
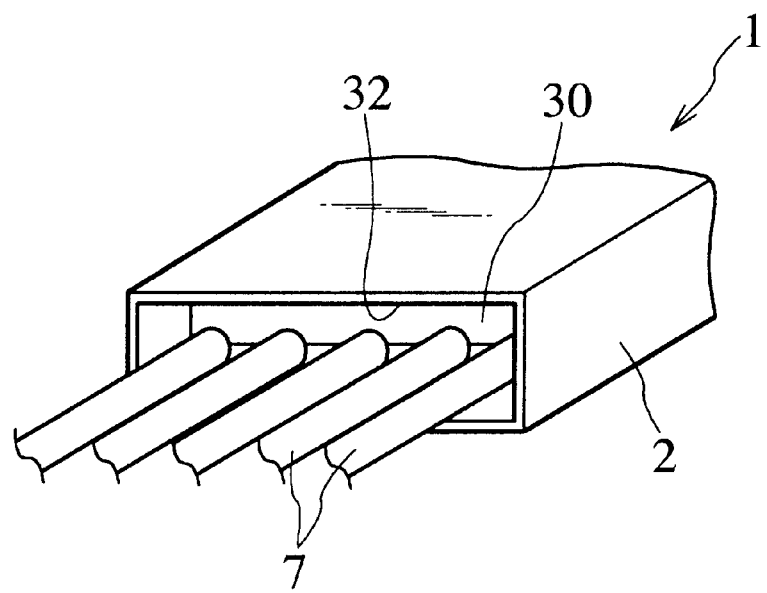

The contents of U.S. Pat. No. 5,584,122 are incorporated herein by reference.

There will be detailed below the preferred embodiments of the present invention with reference to the accompanying drawings. Members which are same as those in FIG. 2 and FIGS. 3A and 3B and members which are same in function as those in FIG. 2 and FIGS. 3A and 3B are designated by like reference characters.

Figure 4:
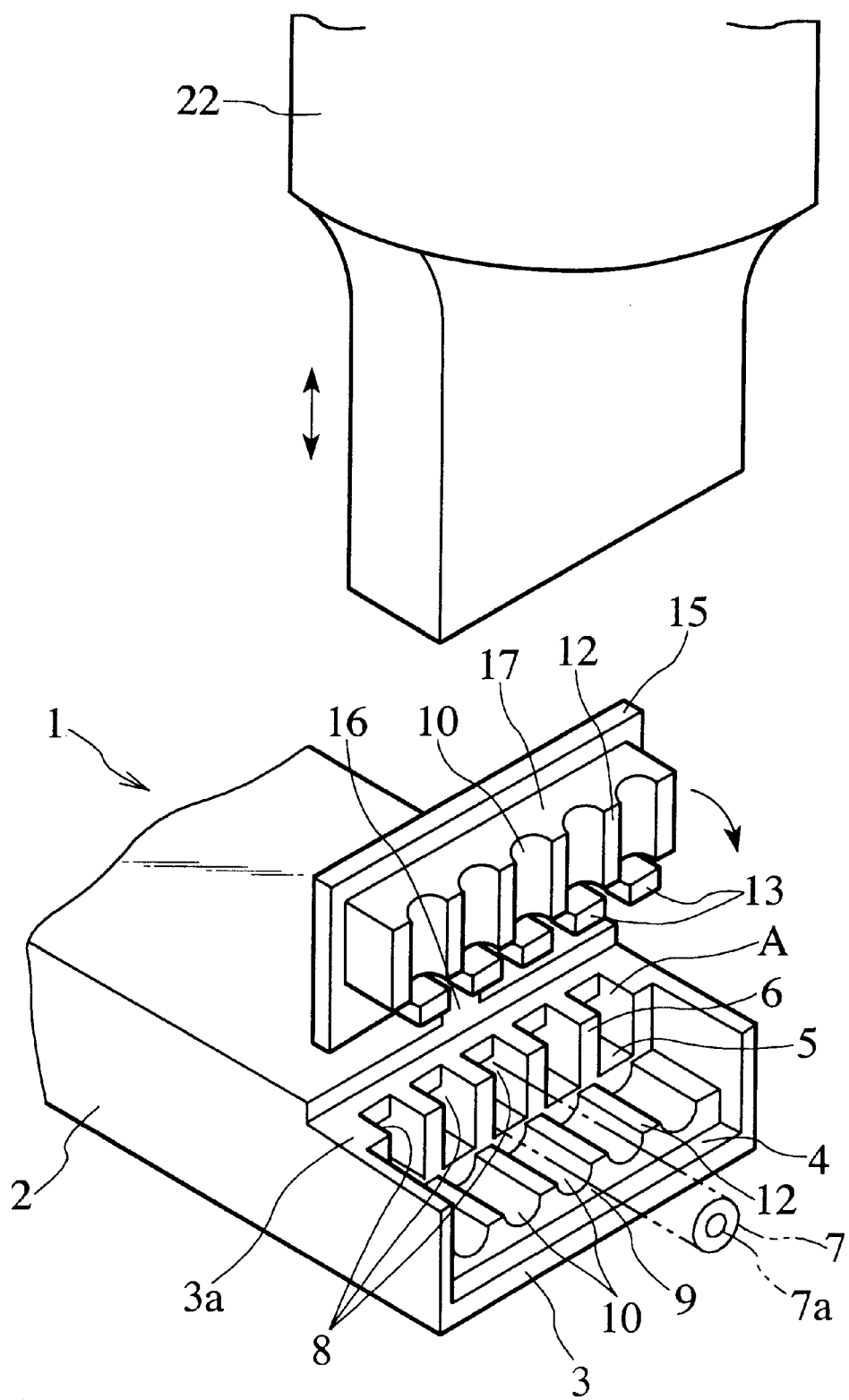
FIG. 4 is a perspective view showing a waterproof connector according to a first embodiment of the present invention.

In FIG. 4, a waterproof connector 1 is constituted by a connector housing 2 shaped like a rectangular parallelopiped and a cover portion 3 formed on a forward end of this connector housing 2, and is made as a whole of plastic. The cover portion 3 has a concavity portion 4 which is upwardly made open and an upper peripheral edge 3a thereof constitutes a level difference portion which is lower in level than the connector housing 2.

With respect to a rear surface of the concavity portion 4 there are formed a bottom surface portion 5 and partitioning plates 6 projecting on the bottom surface portion 5.

This partitioning plate 6 is made integral with, and serves as, a hole wall of each of a plurality of holes 8 through which a covered electric wire 7 passing through the interior of the connector housing 2 is drawn out and the bottom surface portion 5 is flush with a bottom portion of the hole 8 and is continuous thereto.

In a front portion of the bottom surface portion 5 there is mounted a rubber-like elastic member 9 having an upwardly oriented semi-circular accommodation groove 10 in correspondence with each hole 8. The semi-circular accommodation grooves 10 are partitioned by flat ribs 12 corresponding to the partitioning plates 6.

An upper cover 15 is a plate-like member which is integrally mounted on a front end edge of the connector housing 2 through a flexible connection portion 16 and on a front surface of the upper cover 15 there is mounted a rubber-like elastic member 17. In this rubber-like elastic member 17 also there are formed semi-circular accommodation grooves 10 and ribs 12 each having the same configuration.

On a lower portion of the upper cover 15 there are formed core wire waterproofing members 13 which when the upper cover 15 has closed the upper open space of the cover portion 3 are fitted between the partitioning plates 6 and contact with the bottom surface portion 5 and thereby waterproof core wires 7a as later described.

It is to be noted that the upper cover 15 may be formed separately from the connector housing 2. Also, the rubber-like elastic members 9, 17 may be formed integrally with the cover portion 3 and the upper cover 15 or may be formed separately and then bonded thereto by an adhesive material. The material of the rubber-like elastic members 9, 17 is not limited in particular if it is natural rubber, synthetic rubber or other rubber-like materials (elastomer) having elasticity.

Next, a manufacturing process of manufacturing a waterproof connector according to the above-described embodiment will be explained.

(1) A terminal 11 (see FIG. 5) connected to the covered electric wire 7 is retained within the connector housing and the covered electric wire 7 is led out from the hole 8 along the semi-circular accommodation groove 10. At this time, the exposed core wire 7a at a forward end of the covered electric wire 7 and a covering portion 7b covering the core wire 7a are respectively caulked (11a, 11b) and connected to the terminal 11.

(2) Subsequently, the upper cover 15 is rotated in an arrow-indicated direction of FIG. 4, thereby clamping the covered electric wire 7 from above and below by the semi-circular accommodation grooves 10 of the rubber-like elastic members 9, 17 and also clamping the covered electric wire 7 between a forward end surface of the core wire waterproofing member 13 and the bottom surface portion 5.

(3) An ultrasonic horn 22 is lowered and is caused to oscillate ultrasonic waves with a load being applied to the upper cover 15. By the vibration of the core wire waterproofing member 13, the covering portion of the covered electric wire 7 is molten and removed. When the upper cover 15 is lowered due to the load, the core wire waterproofing member 13 and the bottom surface portion 5 are welded to each other, whereby the core wire 7a of the covered electric wire 7 is brought to a state of its being embedded in between the molten core wire waterproofing member 13 and the bottom surface portion 5. This state is shown in FIGS. 5 and 6.

Figure 5:
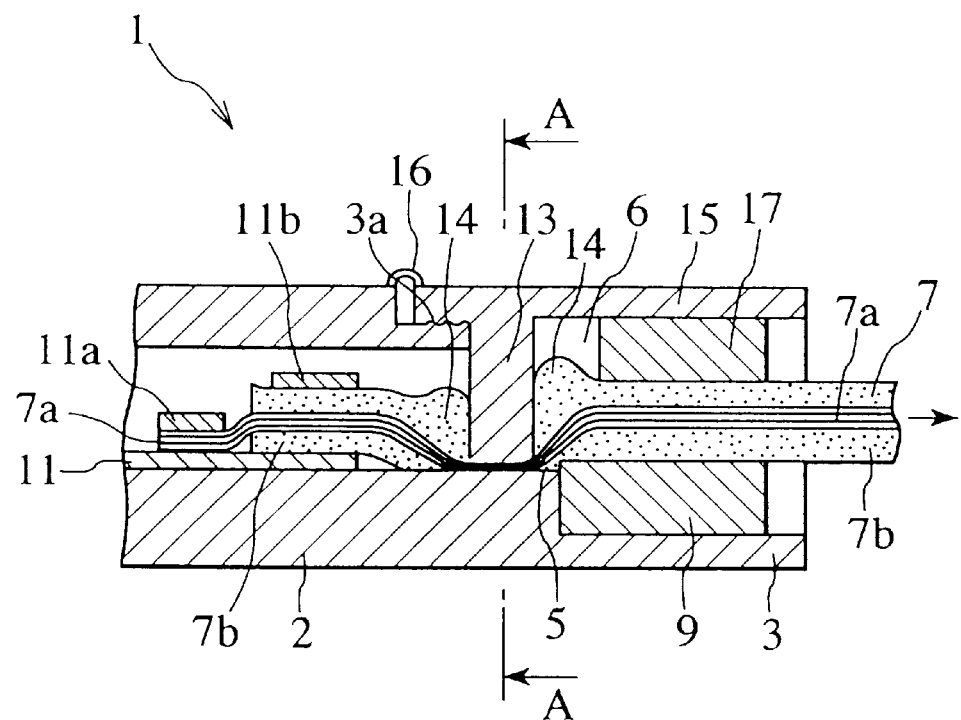
FIG. 5 is a longitudinal sectional side view, after completed, of the waterproof connector.
Figure 6:
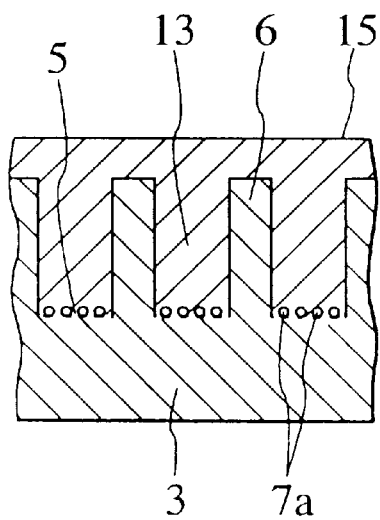
FIG. 6 is a sectional view taken along a line A—A of FIG. 5.

As shown in FIG. 5, the removed covering portion becomes molten masses 14 on both sides of the core wire waterproofing member 13 and the molten masses remain as are by being integrated with the covering portion 7b which has not been molten. The molten masses or upper portions 14 remain in a swollen or expanded state as compared with the covering portion 7b which has not been molten and, for this reason, exhibits a resistance to a pulling force (an arrow-indicated direction of FIG. 5) applied to the covered electric wire 7, thereby causing an increase in the electric wire holding force.

Also, at a terminating state of the ultrasonic wave oscillation, the upper peripheral edge 3a of the cover portion 3 and the peripheral edge portion of the upper cover 15 are welded to each other and simultaneously the rubber-like elastic members 9, 17 are sealed in a state of their being compressed between the cover portion 3 and the upper cover 15.

Incidentally, although in the above-described embodiment the bottom surface portion 5 is made continuous to the bottom surface of the hole 8, the bottom surface portion 5 may be of a configuration of its somewhat protruding from the bottom surface of the hole 8 and, in this configuration, there can be more ensured an escaping space for permitting the escapement of the molten masses 14 of the removed covering portion of the covered electric wire 7.

In the waterproof connector 1 that has been constructed in the above-mentioned way, as shown in FIGS. 5 and 6, the core wire 7a is brought to a state of its being embedded in the welded portion between the core wire waterproofing member 13 and the bottom surface portion 5. Therefore, water that advances along the core wire 7a is stopped there and is prevented from entering into the connector housing 2 and in consequence prevented from causing the electric contact to be shortcircuited or corroded. Thus, a highly enhanced waterproofing effect is obtained in cooperation with the waterproofing effect of waterproofing the covered electric wire by the rubber-like elastic members 9, 17.

While preferred embodiments of the present invention have been described using specific terms, such description is for illustrative purposes, and it is to be understood that changes and variations may be made without departing from the spirit or scope of the following claims.

What is claimed is:

1. A waterproof connector comprising:
   a connector housing;
   a cover portion provided on an end portion of the connector housing and having a covered electric wire passed on a bottom surface portion thereof and drawn out from the connector housing which is constituted by a core wire and a covering portion covering the core wire at a position located therearound; and
   an upper cover portion having a core wire waterproofing member and covering an upper open portion of the cover portion,
   wherein the upper cover portion and the cover portion are welded to each other by application thereto of ultrasonic vibrations;
   the core wire waterproofing member and the bottom surface portion of the cover portion are welded to each other between core wires by application thereto of ultrasonic vibrations;
   the covered electric wire located between the core wire waterproofing member and the bottom surface has its covering portion removed by application thereto of ultrasonic vibrations with the result that the core wire is exposed; and
   the core wire thus exposed is fixed in a state of its being embedded in a welded portion between the core wire waterproofing member and the bottom surface.

2. A waterproof connector according to claim 1, wherein on the cover portion and the upper cover portion there are mounted rubber-like elastic members for sealing the electric wire by pressurizing the electric wire and clamping this electric wire therebetween in such a way as to be situated in front of the core wire waterproofing member.

3. A waterproof connector according to claim 1 or 2, wherein on the bottom surface portion of the cover portion there are formed partitioning plates situated on both side surfaces of the core wire waterproofing member.

4. A waterproof connector according to claim 1, wherein the core wire of the covered electric wire is embedded between a molten portion of the core wire waterproofing member and the bottom surface portion after the application of ultrasonic vibrations.

5. A waterproof connector according to claim 1, wherein at least one upper portion of the covering portion is expanded after the application of ultrasonic vibrations.

6. A waterproof connector according to claim 4, wherein the at least one upper portion comprises first and second upper portions each located on opposite sides of the core wire waterproofing member.

7. A method of manufacturing a waterproof connector covering a covered electric wire drawn out from a connector housing by rubber-like elastic members to thereby waterproof the covered electric wire, the method comprising the steps of:
   causing the covered electric wire to be drawn out from the connector housing and thereafter setting the covered electric wire on the rubber-like elastic member provided on a over portion in front of the connector housing;
   setting an upper cover portion on the cover portion and thereby setting the rubber-like elastic member provided on the upper cover portion on the rubber-like elastic member of the cover portion and simultaneously clamping the covered electric wire between a core wire waterproofing member formed on the upper cover portion and a bottom surface portion of the cover portion; and setting an ultrasonic horn onto the upper cover portion and applying a load onto the upper cover portion while oscillating the ultrasonic horn to thereby weld the cover portion and the upper cover portion to each other and, simultaneously, pressurizing the covered electric wire and clamping the same between the core wire waterproofing member and the bottom portion of the cover portion to thereby weld and fix the core wire waterproofing member and the bottom surface portion to each other while removing a covering portion of the covered electric wire by the ultrasonic oscillation.

8. A method of fabricating a waterproof connector comprising, a housing having a cover portion defining a bottom surface portion and an upper cover portion having a waterproofing member, comprising the steps of:

drawing through the connector housing an electric wire comprising a core wire and a covering portion surrounding the core wire; and ultrasonically welding the core wire waterproofing member on the upper cover portion to the bottom surface of the cover portion so that the covering portion of the covered electric wire is removed between the core wire waterproofing member and the bottom surface portion of the cover portion, thereby exposing the core wire and embedding and affixing the exposed core wire between the welded core wire waterproofing member and bottom surface portion.

\* \* \* \* \*